United States Patent [19]

Murakami et al.

[11] Patent Number: 5,552,625

[45] Date of Patent: Sep. 3, 1996

[54] SEMICONDUCTOR DEVICE HAVING A SEMI-INSULATING LAYER

[75] Inventors: Susumu Murakami, Katsuta; Takuya Fukuda, Hitachi; Yoshiteru Shimizu, Katsuta; Yoshitaka Sugawara, Hitachi, all of Japan

[73] Assignee: Hitachi, Ltd., Tokyo, Japan

[21] Appl. No.: 208,138

[22] Filed: Mar. 9, 1994

[30] Foreign Application Priority Data

Mar. 10, 1993 [JP] Japan .................. 5-049005

[51] Int. Cl.$^6$ .................................. H02L 29/76
[52] U.S. Cl. ............... 257/409; 257/487; 257/488; 257/489; 257/630; 257/636; 257/638; 257/646
[58] Field of Search .............. 257/409, 487–9, 257/630, 636, 638, 646

[56] References Cited

U.S. PATENT DOCUMENTS

| | | | |
|---|---|---|---|
| 4,803,528 | 2/1989 | Pankove | 257/410 |
| 5,086,332 | 2/1992 | Nakagawa et al. | |
| 5,107,323 | 4/1992 | Knolle et al. | 257/630 |
| 5,113,237 | 5/1992 | Stengl | 257/489 |

FOREIGN PATENT DOCUMENTS

| | | | |
|---|---|---|---|
| 0182422 | 5/1986 | European Pat. Off. | |
| 0434914 | 7/1991 | European Pat. Off. | 257/488 |
| 2031082 | 4/1971 | Germany | |
| 52-27032 | 7/1977 | Japan | |
| 63-38259 | 2/1988 | Japan | |
| 3-171774 | 7/1991 | Japan | 257/489 |
| WO85/03167 | 7/1985 | WIPO | |

OTHER PUBLICATIONS

Full English Translation of Japan Kokai 52–027032 published on Mar. 1977.

*Primary Examiner*—J. Carroll
*Attorney, Agent, or Firm*—Antonelli, Terry, Stout & Kraus

[57] ABSTRACT

A semiconductor device has a first semiconductor region of a first conductivity type and a second semiconductor region of a second conductivity type contacted by respective first and second electrodes. A semi-insulating layer extends between the first and second electrodes and there is a first insulating layer between the semi-insulating layer and the first semiconductor region. The sheet resistivity of the semi-insulating layer varies, and this improves the high breakdown voltage of the p-n junction of the semiconductor device between the first and second semiconductor layers, by acting as a shield for charges included on a passivation insulation layer covering the semi-insulating layer and the first and second electrodes. Third semiconductor regions, with corresponding third electrodes, extend around, and are spaced from, the second semiconductor region. The third electrodes extend over the parts of the first semiconductor region adjacent the third semiconductor regions, and this also serve to improve the breakdown voltage. The second electrode may also extend over the part of the first semiconductor region adjacent the second semiconductor region to cover the p-n junction therebetween.

17 Claims, 13 Drawing Sheets

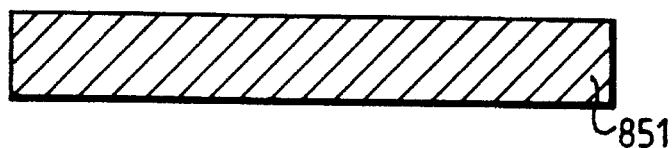
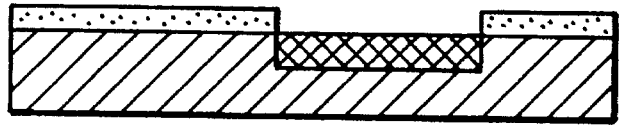
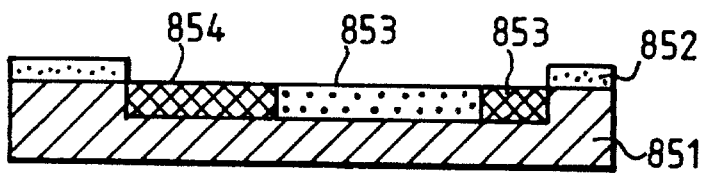
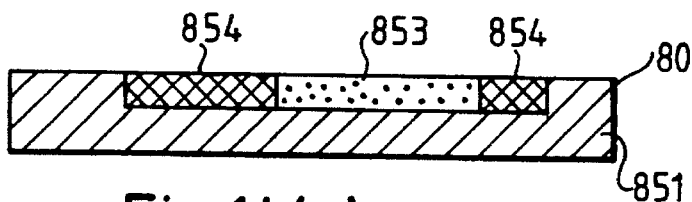
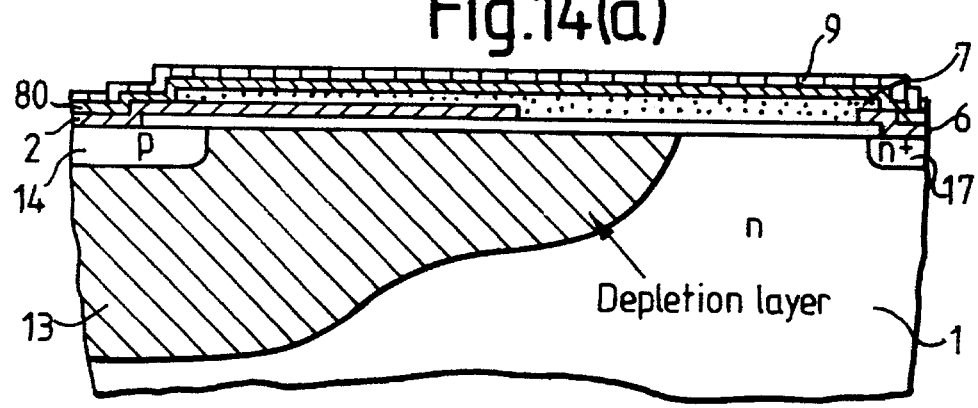

SEMICONDUCTOR DEVICE HAVING A SEMI-INSULATING LAYER

BACKGROUND OF THE INVENTION

1. Field of the Invention

The present invention relates to a semiconductor device having a semi-insulating layer. The term "semi-insulating" is used to denote materials have resistivities in a range between the resistivities of semiconductor materials and the resistivities of insulating materials.

2. Summary of the Prior Art

JP-A-52-27032 discloses a semiconductor device in the form of a planar type diode. The diode disclosed has a first semiconductor region of a first conductivity type and a second region of a second conductivity type extending into the first region. Electrodes contact the first and second regions, with the first semiconductor region having a highly doped part, through which it contacts the electrode to improve the electrical connection therebetween.

In such a planar-type diode, a p-n junction is formed between the first and second semiconductor regions. When a reverse bias is applied to that p-n junction, a depletion region extends from the p-n junction and the spreading of that depletion region will affect the breakdown voltage of the diode. JP-A-52-27032 proposes that the electrodes be interconnected by a semi-insulating layer, with that semi-insulating layer being separated from the first semiconductor region by an insulating layer.

There have been many other proposals which seek to improve the breakdown voltage of planar-type semiconductor diodes, which do not make use of semi-insulating layers. It is known to provide one or more third semiconductor regions, of the same conductivity type as the second semiconductor region, which surround, but do not contact, that second semiconductor region. Electrodes may then be provided which contact the third semiconductor region. JP-A-59-141267 proposes that the third semiconductor regions have extensions extending radially inwardly and/or outwardly. JP-A-59-76466 suggests that there are plurality of such third semiconductor regions, and the electrodes associated therewith extend radially beyond the inward periphery of the third semiconductor region, over the first semiconductor region. To prevent direct contact between the third electrodes and the first semiconductor region, there is insulating material therebetween. Similarly, JP-A-57-155773 discloses that the third electrodes may extend radially outwardly, again covering part of the first semiconductor region with insulating material therebetween.

It should also be noted that JP-A-52-27032 discloses annular third semiconductor regions, without electrodes, below the semi-insulating layer, and JP-A-61-127184 discloses an arrangement similar to JP-A-52-27032 but in which the annular third semiconductor regions have different widths, and have different radial spacings therebetween.

Finally, U.S. patent application Ser. No. 4,691,223 discloses the use of a semi-insulating layer in a transistor structure, with the semi-insulating layer interconnecting the emitter and collector.

SUMMARY OF THE PRESENT INVENTION

It is normal for planar-type semiconductor devices, such as the semiconductor diodes discussed above, to be covered with an insulating layer for the purposes of passivation. Such a passivation layer may be of resin or of plastics material. However, if electric charges build up on the outer surface of the passivation layer, of the same or opposite polarity to the carriers of the semiconductor region under the passivation layer, electric charges of the reverse polarity may be induced in that semiconductor region which will then affect the breakdown voltage of the semiconductor device. The breakdown voltage is dependent on the electric field gradient in the semiconductor region, and it can readily be appreciated that the inducing of charge in part of that region may cause local concentrations in the electric field density, leading to breakdown. It is very easy for such charges to be induced on the surface of the passivation layer, e.g. due to droplets of water thereon or even due to high humidity levels, for example of 90% RH or greater.

If a passivation layer is formed over the semiconductor device disclosed in JP-A-52-27032, the semi-insulating layer will act to shield the semiconductor regions from charges on the surface of the passivation layer. When a reverse bias is applied to the semiconductor device, a current flows from the semi-insulating layer. That current causes the potential in the semi-insulating layer to be constant, so that the semiconductor regions are shielded from the effect of external charges.

However, it has been found that there are two potential defects in such an arrangement.

Firstly, the semi-insulating layer must be separated from the semiconductor regions below it by an insulating layer. Therefore, a capacitance is formed, and hence the potential in the semi-insulating layer will not become uniform instantaneously when a rapidly rising voltage is applied to the device. In such circumstances, the shielding effect of the semi-insulating layer will be lost.

Secondly, it was assumed in JP-A-52-27032 that the sheet resistivity of the semi-insulating layer was uniform. Therefore, the variation in potential along the semi-insulating layer between the electrodes will also be uniform. However, the potential at the surface of the semiconductor region below the semi-insulating layer does not vary uniformly. As a result, local build-up of electric field intensity may occur within the semiconductor region, leading to lower breakdown voltages.

It has been realized that both of these problems may be overcome, or at least ameliorated, by varying the sheet resistivity of the semi-insulating film. This is thus a first aspect of the present invention.

Preferably, the sheet resistivity of the semi-insulating film is varied such that the potential thereof will vary in a way which corresponds to the variation in field intensity within the semiconductor region below the semi-insulating layer. Normally, to achieve this, the sheet resistivity of the semi-insulating layer has a maximum value intermediate the electrodes. That maximum value is preferably at least double the sheet resistivity adjacent the electrodes, and may as much as five times as great as the sheet resistivity adjacent the electrodes.

The value of the sheet resistivity will depend on the detailed structure of the device, and therefore can be selected to achieve the desired aim of the present invention. The sheet resistivity needs to be less than the sheet resistivity of the passivation film, and is therefore normally less than $10^{15}\Omega/\square$. Preferably, the sheet resistivity is significantly less than that value, e.g. of the order of $10^{13}\Omega/\square$. The minimum value of the sheet resistivity of the semi-insulating layer is influenced by other factors. Of course, if the sheet resistivity is too small, the layer will not behave as a semi-insulating layer at all. Above this value, the main influences on the maximum permitted leakage current of the semiconductor device. Since the semi-insulating layer interconnects the electrodes of the device, and permits a current to flow therebetween, a leakage current will flow which will be affected by the sheet resistivity of the semi-insulating layer. However, the maximum permitted leakage current will depend on the use to which the semiconductor device is put.

As was mentioned above, it is desirable for the variation in sheet resistivity of the semi-insulating layer to vary so that its potential conforms potentially to the variation in field in the semi-conductor region below the semi-insulating layer. Therefore, from this viewpoint, it is preferable for the sheet resistivity to vary gradually. However, for ease of manufacture, it is possible for the sheet resistivity of the semi-insulating layer to vary in a stepwise manner.

In a development of the first aspect of the present invention, it is possible to provide one or more third semiconductor regions which extend around, but are spaced from the second semiconductor region. Electrodes may then be provided which contact the third semiconductor region or regions. Those third electrodes, and possibly also the second electrode, preferably extend over the adjacent parts of the first semiconductor region as this also improves the breakdown voltage of the semiconductor device. Indeed, satisfactory performance may be achieved by providing such an electrode arrangement in combination with a semi-insulating layer of varying or constant sheet resistivity. Therefore, this represents a second, independent, aspect of the present invention.

Preferably, a plurality of the third semiconductor regions are provided, which extend concentrically around the second semiconductor region. Such third semiconductor regions may be of uniform doping concentration, or may have an inner region with a high doping concentration and an outer region with a low doping concentration.

As was mentioned above, there is an insulating layer between the semi-insulating layer and the semiconductor regions thereunder. Although that insulating layer may be formed of a single insulating film, it is preferably formed of more than one film. This is particularly advantageous when third semiconductor regions and corresponding third electrodes, are provided. Then, one insulating film of the insulating layer may extend between the electrodes and the semiconductor material with the electrodes extending through openings in that film to contact the third semiconductor regions, and another film may extend over the third electrodes to separate the third electrodes from the semi-insulating layer.

Thus, the present invention permits the breakdown voltage of a semiconductor device, such as a planar-type semiconductor device to be increased, thereby improving the performance of the semiconductor device.

BRIEF DESCRIPTION OF THE DRAWINGS

Embodiments of the present invention will now be described in detail, by way of example, with reference to the accompanying drawings, in which:

FIGS. 13(a) to 13(d) form a flowchart of another example of a method for fabricating the semi-insulating film shown in FIG. 7(b);

FIG. 14(a) is a schematic sectional view of a high breakdown voltage planar-type semiconductor device, being a fourth embodiment of the present invention, and FIG. 14(b) is a diagram of the variations in sheet resistivity of the semi-insulating layer in the embodiment of FIG. 14(a);

DETAILED DESCRIPTION

Figure 1A:
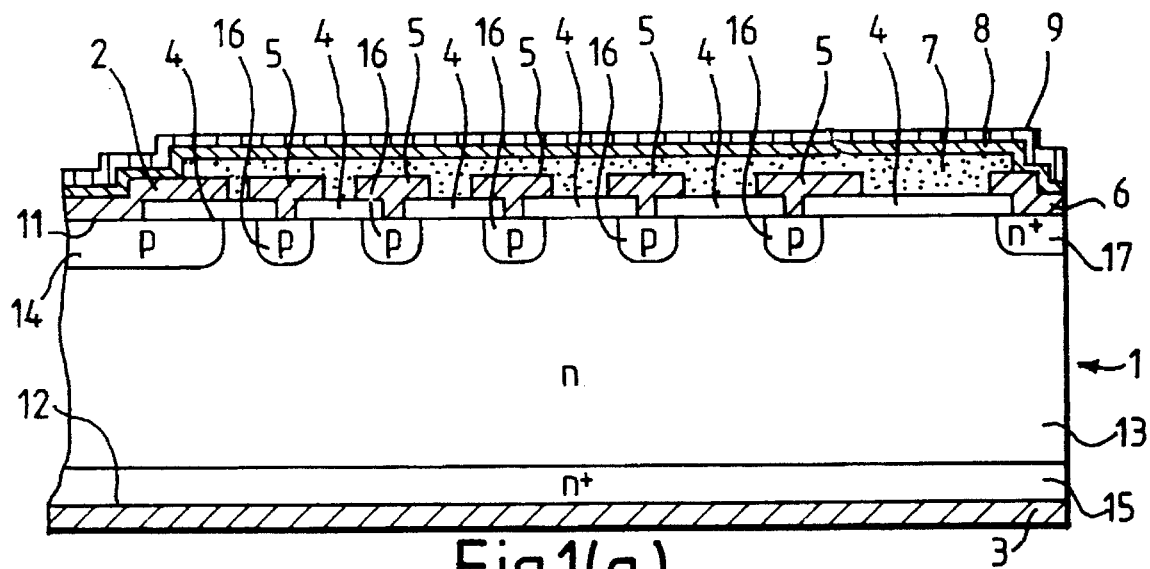
FIGS. 1(a) and 1(b) are schematic sectional and plan views of a high breakdown voltage planar-type semiconductor device, being a first embodiment of the present invention, FIG. 1(a) being along the line A-A$^1$ in FIG. 1(b)
Figure 1B:
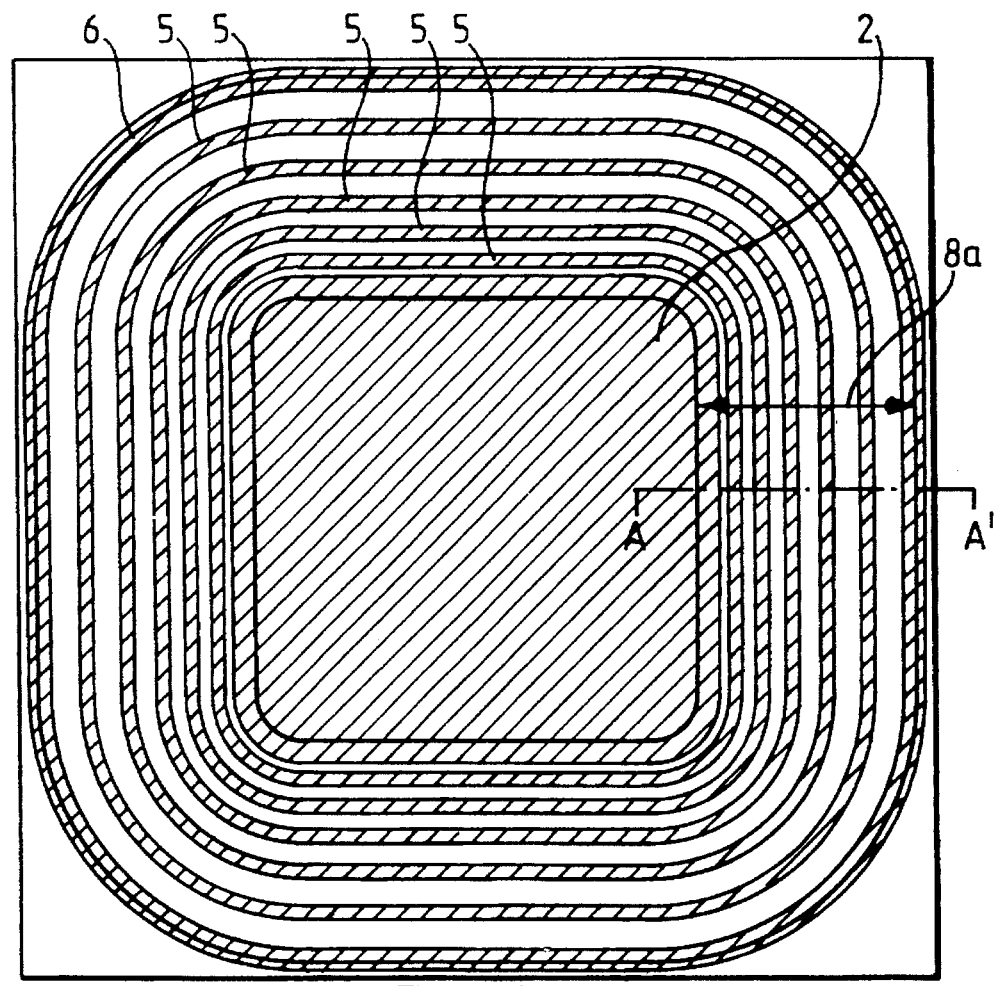

FIGS. 1(a) and 1(b) are schematic sectional view and plane views of a first embodiment of a high breakdown voltage planar-type semiconductor device according to the present invention.

In FIG. 1(a), a semiconductor substrate has a pair of main surfaces 11 and 12. The substrate contains an n-type semiconductor layer 13 which extends to one main surface 11. A p-type semiconductor layer 14 extends from the main surface 11 into the n-type semi-conductor layer 13, together with the n-type semiconductor layer 13, and forms a planar-type first pn junction at the center of the main surface 11. There is also an $n^+$-type semiconductor layer 15 between the other main surface 12 and the n-type semiconductor layer 13, which has an impurity concentration higher than that of the n-type semiconductor layer 13. A plurality of p-type electric-field control ring regions 16 extend from the main surface 11 into the n-type semi-conductor layer 13 and surround the p-type semi-conductor layer 14 at the periphery of the main surface 11. An $n^+$-type ring region 17 which has an impurity concentration higher than that of the n-type semiconductor layer 13, extends from the main surface 11 into the n-type semiconductor layer 13 and surrounds the p-type electric-field control ring regions 16. The n-type semiconductor layer 13, the $n^+$-type semiconductor layer 15, and the $n^+$type ring region 17 then form a semiconductor region 1 of the opposite conductivity type to the p-type semiconductor layer 14, so that a diode is formed.

A first main electrode 2 is in ohmic contact with the p-type semiconductor layer 14, and a second main electrode 3 is in ohmic contact with the $n^+$-type semiconductor layer 15. There is a first insulating film 4 on the main surface 11, and a plurality of first auxiliary electrodes 5 are in ohmic contact with the p-type electric-field control ring regions 16 through openings in the first insulating film 4. The shape of the first auxiliary electrodes 5, which corresponds to the shape of the electric-field control regions 16 is shown in FIG. 1(b). The first auxiliary electrodes 5 extend above the n-type semiconductor layer 13 on both sides of each p-type electric-field control ring region 16 on the first insulating film 4. Thus, the first auxiliary electrodes 5 extend beyond the periphery of each p-type electric-field control ring region 16 to cover the adjacent parts of the n-type semiconductor layer 13, and so overlap the pn junctions between the n-type semiconductor layer 13 and the p-type electric field control regions 16. A second auxiliary electrode 6 is in ohmic contact with the $n^+$-type ring region 17, and there is a second insulating film 7 on the main electrode 2, first auxiliary electrode 5, and second auxiliary electrode 6. The shape of the second auxiliary electrode 6 is shown in FIG. 1(b).

There is a semi-insulating film 8 on the second insulating film 7, opposite ends of which contact the electrode 2 and second auxiliary electrode 6. A third insluting film 9 on the semi-insulating film 8 serves as a final protective film for the semiconductor device. The width of the semi-insulating film is shown by arrow 8a in FIG. 1(b).

The reasons for the high breakdown voltage and high reliability of the semiconductor device shown in FIG. 1 will now be discussed.

When a voltage is applied which makes the first main electrode 2 negative and/or the second main electrode 3 or second auxiliary electrode 6 positive, (i.e. a voltage which reverse biases the first pn junction formed between the p-type semiconductor layer 14 and n-type semiconductor layer 13), a depletion layer is formed which extends from the first pn junction into the n-type semiconductor layer 13. Because the first main electrode 2 extends over the first pn junction and the adjacent part of the semiconductor layer 13, the depletion layer formed at the first pn junction expands further due to the electric field effect (field plate effect. of the main electrode 2. This is due to the fact that, as the depletion layer expands, the field intensity of the first pn junction surface is relaxed and avalanche breakdown is unlikely to occur.

In this first embodiment of the present invention, the first auxiliary electrodes 5 contacting the electric-field control ring region 16 closest to the p-type semiconductor layer 14 extend over the adjacent parts of the n-type semiconductor layer both radially inwardly and outwardly relative to the first pn junction. The parts of the first auxiliary electrodes 5 covering parts of the n-type semiconductor region 13 radially inwardly of the electric-field control regions 16 have the function of limiting the expansion of the depletion layer extending from the first pn junction. Unless such parts of the first auxiliary electrodes 5 extend over the parts of the corresponding n-type semiconductor region, electrical charge which is negative relative to the n-type semiconductor layer 13 which accumulates in the first insulating film 4 increase the expansion of the depletion layer from the first pn junction and decrease the shared voltage drop between the p-type semiconductor layer 14 and the adjacent electric-field control ring region 16.

The phenomenon described above also occurs in the other electric-field control ring regions 16. Thus, the voltage drop from the p-type semiconductor layer 14 to the outermost electric-field control ring region 16 decreases and the voltage drop between the outermost electric-field control ring region 16 and the $n^+$-type ring region 17 increases. The field intensity at the surface of the n-type semiconductor layer 13 close to the $n^+$-type ring region 17 increases. This causes a reduction in the breakdown voltage or an increase in the leakage current. Therefore, when the depletion layer extending from the first pn junction or the second pn junction between the electric-field, control ring region 16 and n-type semiconductor layer 13 expands, avalanche breakdown at the first pn junction is unlikely to occur but it is likely to occur in the vicinity of the end of the depletion layer. When an electrode covers only the second pn junction between the electric-field control ring region 16 close to the first pn junction and n-type semiconductor layer 13 in order to prevent avalanche breakdown, electric charges which are positive relative to the n-type semiconductor layer 13, which accumulate in the first insulating film 4 and the third insulating film 9, reduce the expansion of the depletion layer from the first pn junction and increase the voltage drop between the p-type semiconductor layer 14 and electric-field control ring region 16. As a result, the breakdown voltage may be reduced or the blocking characteristic may show a soft waveform. However, since the first main electrode 2, first auxiliary electrode 5, and second auxiliary electrode 6 respectively extend over the adjacent parts of the n-type semiconductor layer 13, to cover the surfaces of the first pn junction, second pn junction, and the $nn^+$ junction between the n-type semiconductor layer 13 and the n-type ring region 17, a high breakdown voltage and high-reliability blocking characteristic is obtained. Moreover, a similar effect is achieved if the above junctions are only partially covered.

In the first embodiment of the present invention, the semi-insulating film 8 is formed on the second insulating film 7 so as to connect the main electrode 2 and the second auxiliary electrode 6. When a voltage is applied which makes the first main electrode 2 negative and the second main electrode 3 or second auxiliary electrode 6 positive, (i.e. a voltage which reverse biases the first pn junction), a depletion layer extends from the first pn junction into the n-type semiconductor layer 13 as previously discussed. Hence potential distribution is formed on the main surface 11 of the semiconductor substrate 1. When positive or negative electric charges are present on the third insulating film 9, the potential at the main surface 11 of the semiconductor substrate 1 is changed and the blocking characteristic changes. However, by applying a current to the semi-insulating film 8, the potential in the semi-insulating film 8 becomes constant and it is possible to eliminate the influence of external electric charges on the semiconductor device.

However, if the time constant CR, due to the sheet resistivity of the semi-insulating film and the capacitance of insulating films under the semi-insulating film, has a constant value, the potential in the semi-insulating film does not become constant instantaneously when a rapidly rising voltage rate is applied. Therefore, when a rapidly rising voltage is applied, the electric-field relaxing effect of the semiconductor substrate surface is lost. The field intensity at the surface of the pn junction between the electric-field control ring regions 16 and semiconductor substrate 1 increases, and the breakdown voltage is reduced.

Moreover, the inventors of the present invention have discovered that the semi-insulating film does not have any effect at all when the relative humidity is, for example, 90% or more and the sheet resistivity of the semi-insulating film is $10^{15}\Omega/\square$ or more. Therefore, in this embodiment of the present invention it is proposed that the sheet resistivity of the semi-insulating film 8 is set to $10^{15}\Omega/\square$ or less, to prevent variation of the blocking characteristic even if a rapidly rising voltage is applied in a high-humidity atmosphere. Preferably, the sheet resistivity is not greater than $10^{13}\Omega/\square$.

Figure 2A:
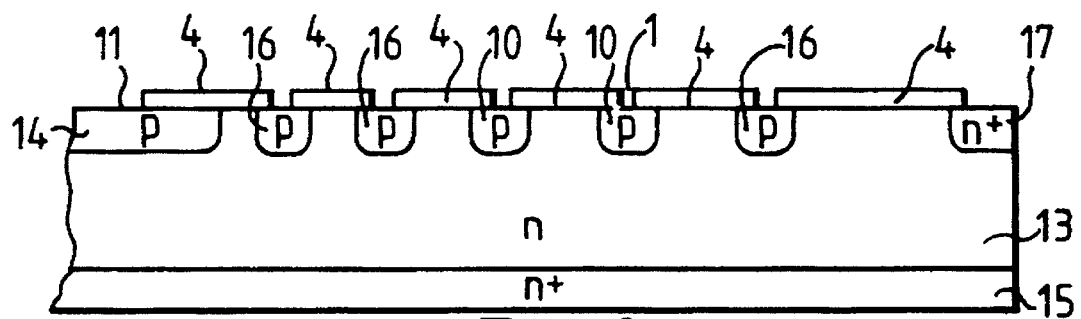
FIGS. 2(a) to 2(f) show steps of an example of a method for fabricating the semiconductor device of FIG. 1.
Figure 2B:
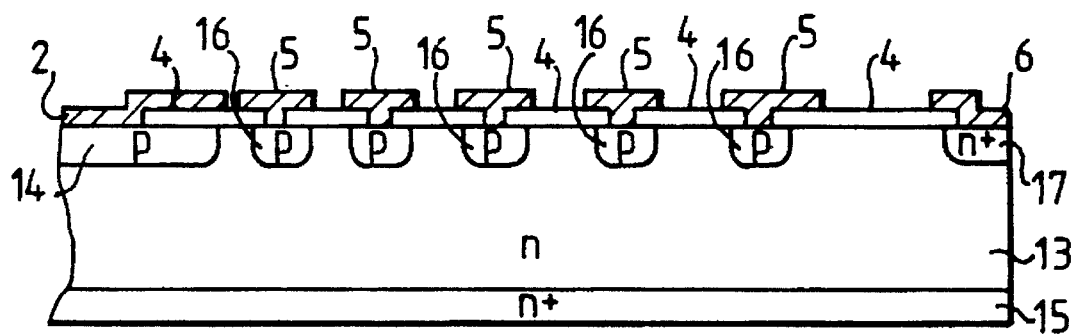

A method of fabricating the semiconductor device shown in FIG. 1 will now be described referring to FIGS. 2(a) through 2(f). The first stage of fabrication, shown in FIG. 2(a), is the formation of the p-type semiconductor layer 14, electric-field control ring regions 16, and the n+-type ring region 17 by thermal diffusion or ion implantation and also the formation of the first insulating film 4 with openings through which electrodes are to extend. Then, as shown in FIG. 2(b), the first main electrode 2, the first auxiliary electrodes 5, and the second auxiliary electrode 6 are formed. They are selectively formed by electron beam deposition or sputtering, or they are formed on the whole surface and thereafter selectively etched.

Figure 2C:
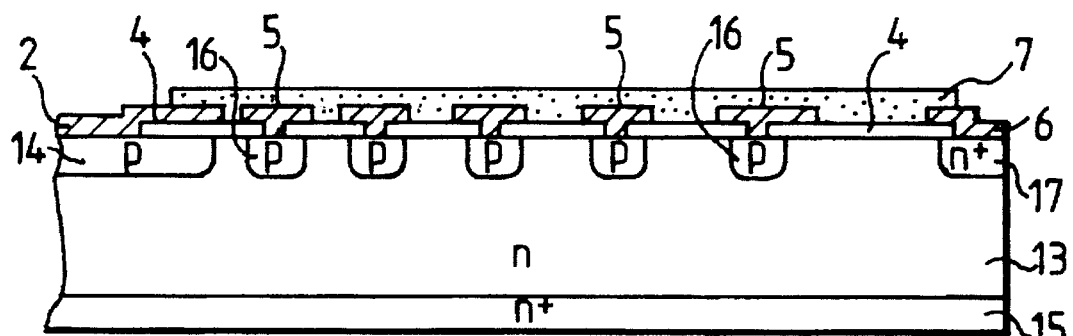
Figure 2D:
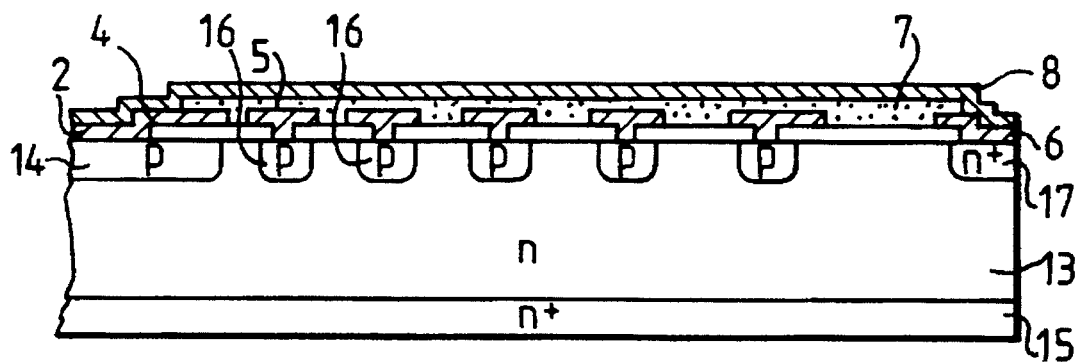
Figure 2E:
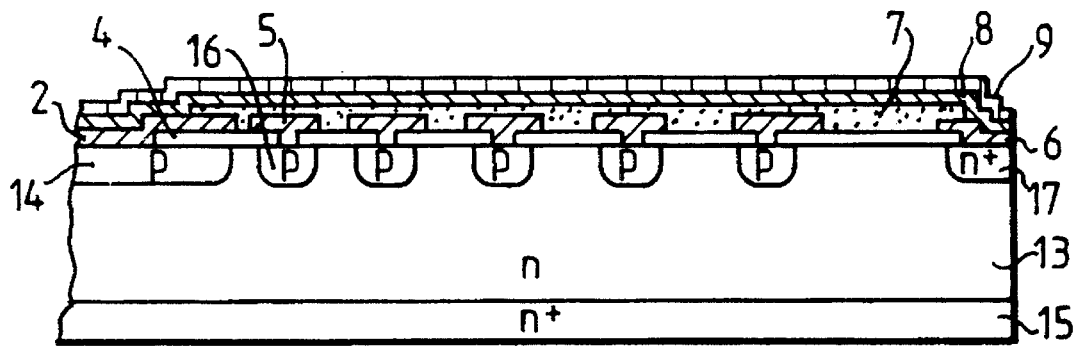
Figure 2F:
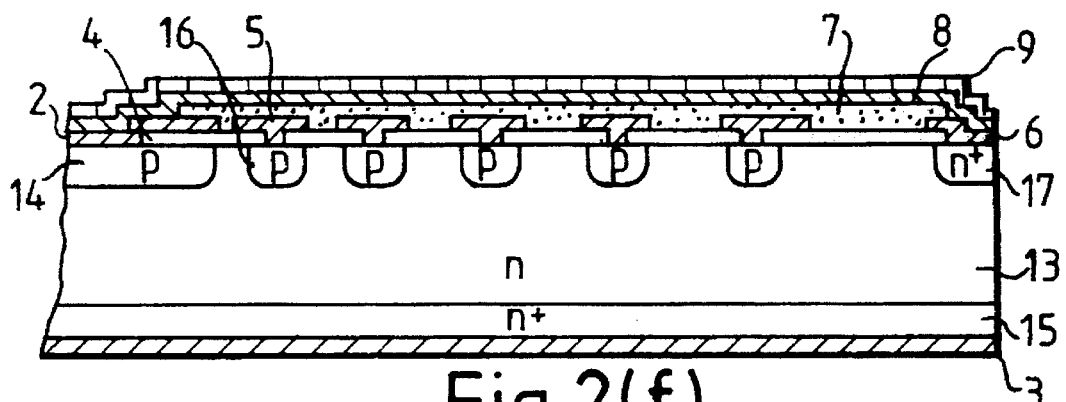

Next, as shown in FIG. 2(c), a thick second insulating film 7 is formed on the whole of the exposed surface of each electrode on the first insulating film 4 by P-CVD or microwave CVD, and parts of the first main electrode 2 and of the second auxiliary electrode 6 are then exposed by ordinary photoetching. The semi-insulating film 8 is then formed on the first main electrode 2 and the second auxiliary electrode 6 as shown in FIG. 2(d). The third insulating film 9 is formed on the semi-insulating film 8, as shown in FIG. 2(e). Finally, the second main electrode 3 is formed on the n+-type semiconductor layer 15, as shown in FIG. 2(f).

Figure 3:
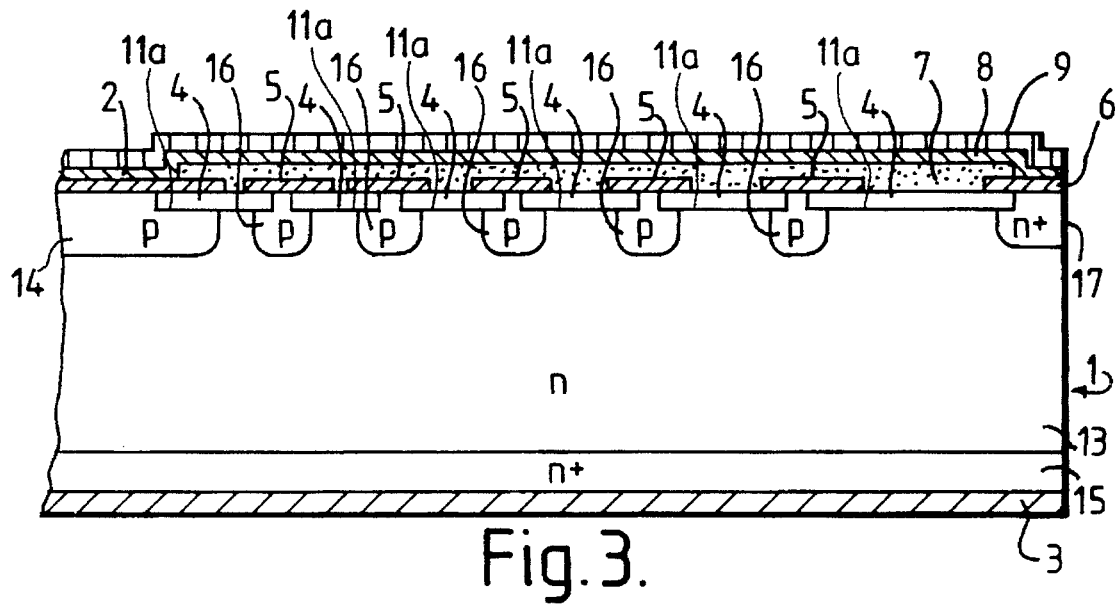
FIG. 3 is a schematic sectional view of a high breakdown voltage planar-type semiconductor device, being a second embodiment of the present invention.

FIG. 3 is a schematic sectional view of a high breakdown voltage planar-type semiconductor device, being a second embodiment of the present invention. Parts of the second embodiment which correspond to parts of the first embodiment are indicated by the same reference numerals. The second embodiment is in plan similar to the arrangement shown in FIG. 1(b)

It has been found that it is better to increase the thicknesses of the first insulating film 4 and second insulating film 7 located under the semi-insulating film 8 as much as possible. Then, with respect to the CR time constant discussed above, when the capacitance C by the first insulating film 4 and second insulating film 7 is decreased, the time constant can be decreased. Moreover, when the thicknesses of the first insulating film 4 and second insulating film 7 are increased, it is possible to prevent changes in the electric lines of force extending from the inside of the semiconductor substrate 1 due to the potential of the semi-insulating film 8.

FIG. 3 shows an embodiment which makes use of such a principle. The embodiment in FIG. 3 differs from that of FIG. 1 in that there is a recess 11a in the portion where the first insulating film 4 of one main surface 11 of the semiconductor substrate 1 is to be formed. The first insulating film 4 is then formed in the recess 11a so that the main surface 11 and first insulating film 4 are approximately flush with each other. It is then possible to decrease the maximum thicknesses of the main electrode 2, the first auxiliary electrode 5, and the second auxiliary electrode 6 because they do not have to extend through openings in the first insulating film 4. This minimizes unevenness of the surface after the electrodes are formed. Therefore, it is possible to increase the thickness of the second insulating film 7 without causing damage such as cracking. Alternatively, however, it is possible to cover the electrodes 2, 5 and 6 with a spin-on glass layer (500 layer), which will also reduce cracking.

Figure 4A:
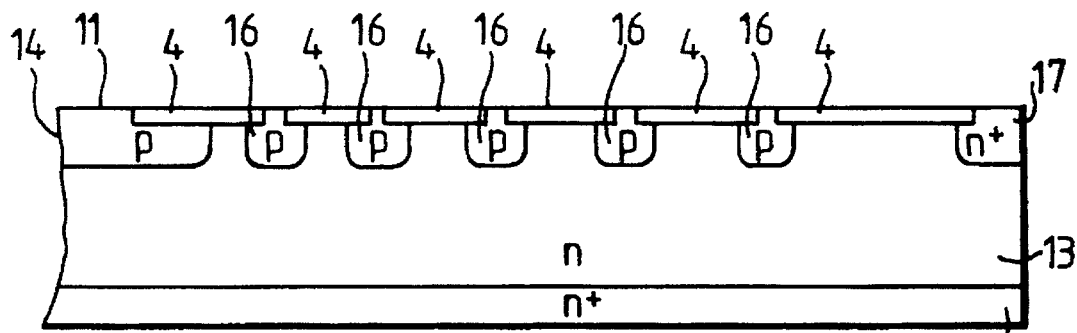
FIGS. 4(a) to 4(f) show steps of an example of a method for fabricating the semiconductor device of FIG. 3.

A method of fabricating the semiconductor device shown in FIG. 3 will be described below, with references to FIGS. 4(a) though 4(f). Most of the details of the fabrication method are the same as those shown in FIG. 2. The difference lies in the fact that, as shown in FIG. 4(a), the surfaces of the first insulating film 4 in contact with the n-type semiconductor layer 13 are located closer to the main surface 12 than the surfaces where the p-type semiconductor layer 14 is to contact the main electrode 2, the electric-field control ring regions 16 is to contact the first auxiliary electrodes 5, and the n+-type ring region 17 is to contact the second auxiliary electrode 6.

Figure 4B:
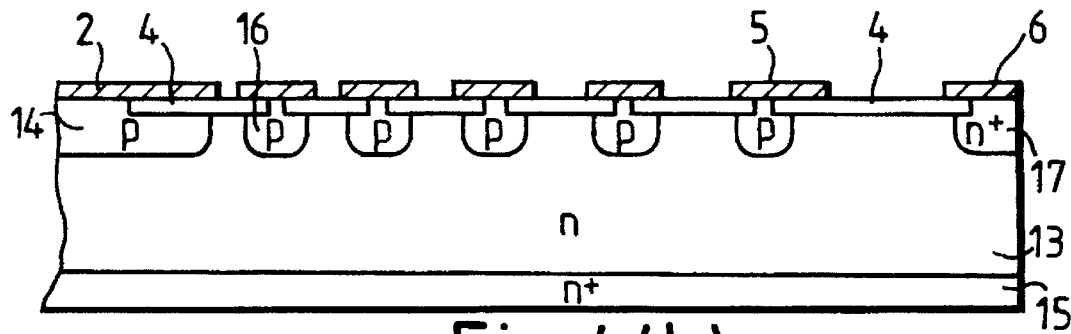
Figure 4C:
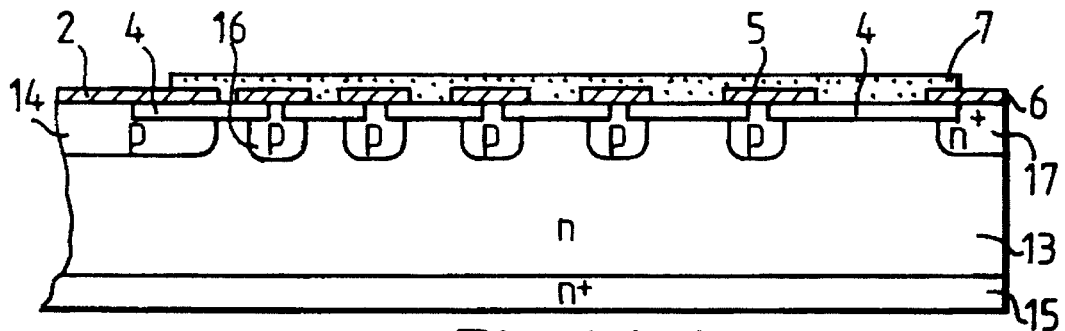
Figure 4D:
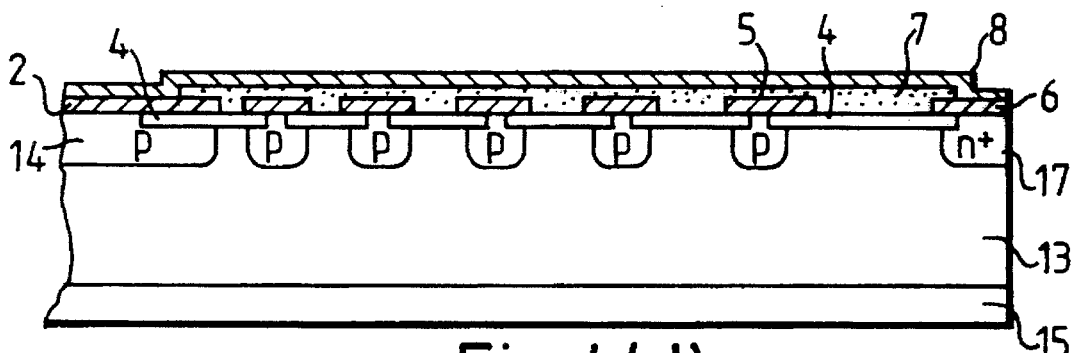
Figure 4E:
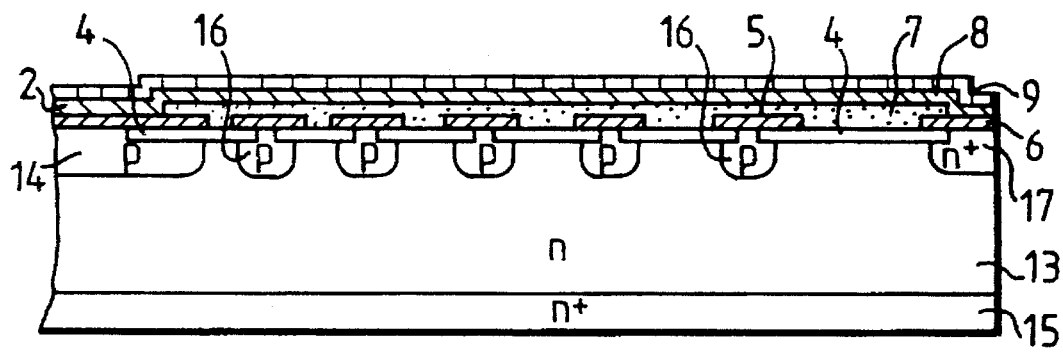
Figure 4F:
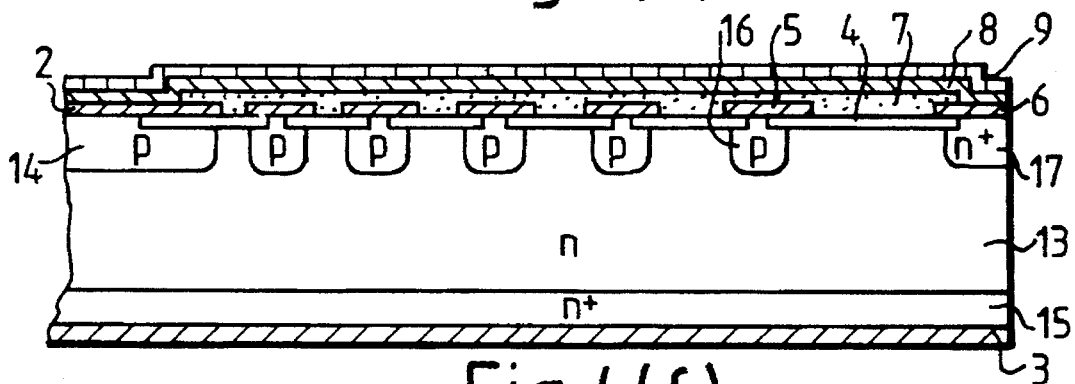

To achieve this, it is possible to apply a LOCOS oxidation method using a combination of an $Si_3N_4$ film with a $SiO_2$ film. An $Si_3N_4$ film and an $SiO_2$ film are form on the portions of the surface which are to contact the electrodes. The other portions are oxidized and then the $Si_3N_4$ film is removed. By reducing the thickness of the $SiO_2$ layer, the electrodes can be exposed leaving an $SiO_2$ film therebetween. Alternatively an $Si_3N_4$ film and an $SiO_2$ film may be formed, and portions where the first insulating film is to be formed is then removed by photoetching. Oxidizing the portion by way of CVD forms the first insulating film. The $Si_3N_4$ film is then removed, and the thickness of the $SiO_2$ layer reduced, to expose the electrodes and leave the $SiO_2$ film therebetween. Because the surface can be flattened by performing the above treatment, the thicknesses of the main electrode 2, first auxiliary electrode 5, and second auxiliary electrode 6 can be decreased as shown in FIG. 4(b). Therefore, the thickness of the second insulating film 7, shown in FIG. 4(c), can be increased without causing damage such as cracking. The description of the subsequent steps is omitted because they correspond to those shown in FIGS. 3(d) through 3(f).

Figure 5:
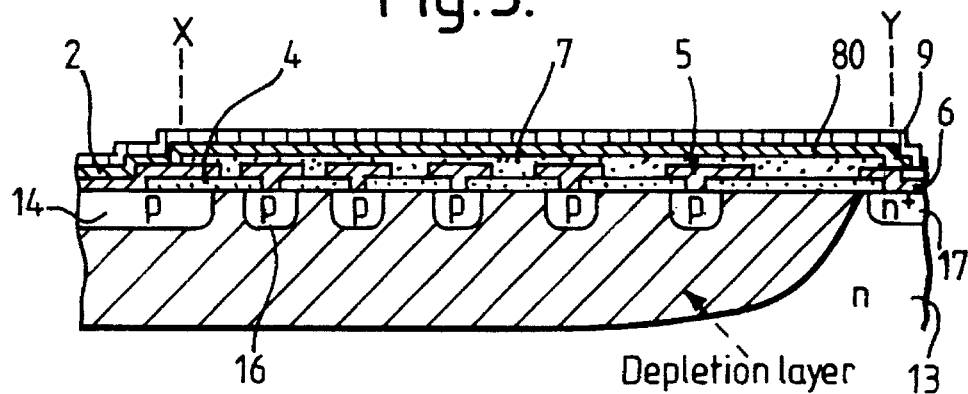
FIG. 5 is schematic sectional view of a high breakdown voltage planar-type semiconductor device being a third embodiment of the present invention.

FIG. 5 is a schematic sectional view of a third embodiment of a high-withstand-voltage planar-type semiconductor device according to the present invention. Parts of the third embodiment which correspond to parts of the first embodiment are indicated by the same reference numerals. In the third embodiment, the sheet resistivity of a semi-insulating film 80 varies with a distribution corresponding to that shown in FIG. 6(a). This makes it possible to achieve a breakdown voltage higher than that of the semiconductor device shown in FIG. 1. This will be described below with reference to FIGS. 6(b) and 6(c).

Figure 6A:
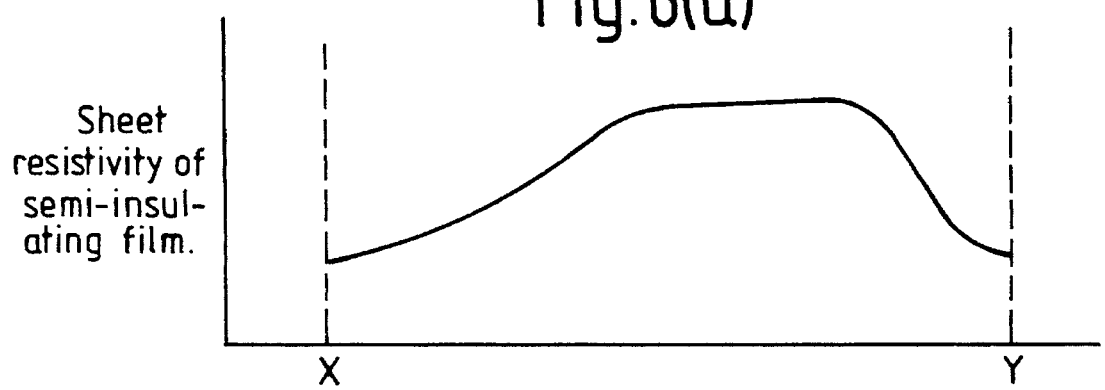
FIGS. 6(a) to 6(c) are diagrams showing the sheet resistivity of semi-insulating film, semiconductor substrate surface potential, and potential and electric-field distributions in a semi-insulating film.
Figure 6B:
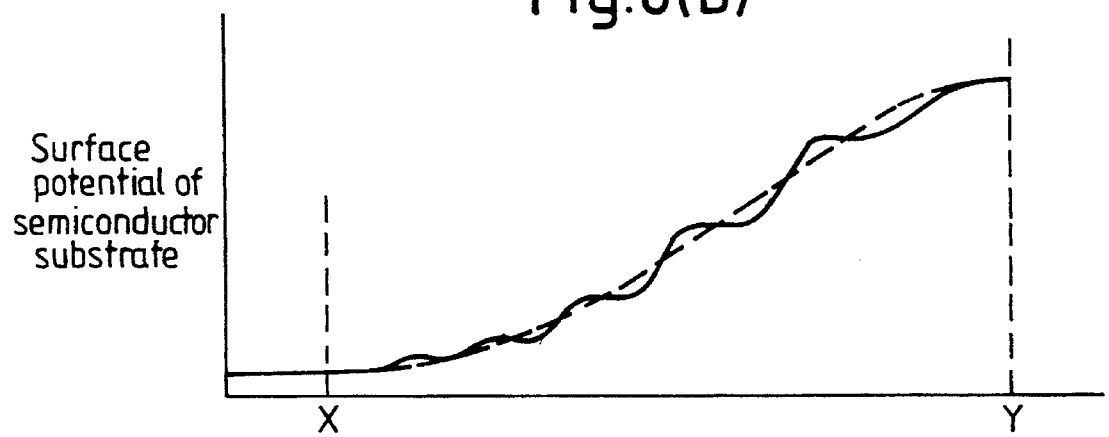
Figure 6C:
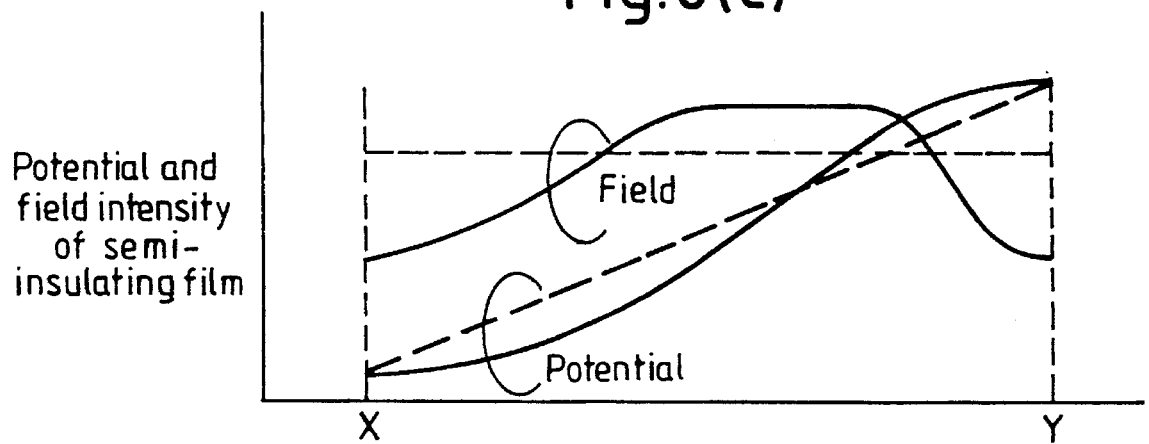

FIG. 6(b) shows the potential distribution of the semiconductor substrate surface when the first pn junction is reverse biased. In FIG. 6(b), the continuous line represents the actual potential distribution and the dotted line represents an approximate potential distribution. In FIG. 6(c), the dotted line shows the potential and field intensity of the semi-insulating film 8 of the device shown in FIGS. 1(a) and 1(b) and the continuous line represents the potential and field intensity of the semi-insulating film 80 of the device shown in FIG. 5.

When the semi-insulating film has a uniform sheet resistivity, as in the first embodiment, the electric field distribution in the semi-insulating film is linear and therefore the potential distribution is also linear. This potential distribution, differing from the potential distribution of the semiconductor substrate surface, is changed by the potential of the semi-insulating film, and the field intensity increases locally. Therefore, the distribution is not satisfactory for achieving a high breakdown voltage. Because the semi-insulating film 80 of the device shown in FIG. 5 has a varying sheet resistivity distribution shown in FIG. 6(a), it has an electric field distribution similar to the variation in sheet resistivity. Converting the electric field distribution to the potential distribution of the semi-insulating film 80, the potential is lower than the case when the film has a uniform sheet resistivity adjacent to the p-type semiconductor layer 14, and higher than that when it has a uniform sheet resistivity adjacent to the $n^+$-type ring region 17. Because the potential distribution coincides substantially with that of the semiconductor substrate surface shown in FIG. 6(b), the potential of the semi-insulating insulating film does not change the potential on the surface of the semiconductor substrate surface. Therefore, a breakdown voltage higher than that of the device in FIGS. 1(a) and (b) results.

FIG. 6(a) is schematic and specific values of sheet resistivity are not shown. In practice, the maximum value of the sheet resistivity (at a point intermediate between the ends of the semi-insulating layer) is at least double, possibly as much as five times the maximum value.

Figure 7A:
FIGS. 7(a) and 7(b) are diagrams showing the sheet resistivity distributions of a semi-insulating film which may be used in a high breakdown voltage planar-type semiconductor device which is in accordance with the present invention.

There are several ways of achieving the varying sheet resistivity discussed above. FIG. 7(a) shows an example in which the distribution shown in FIG. 6(a) is achieved by gradually changing the thickness of a semi-insulating film, which has a uniform resistivity, and FIG. 7(b) shows an example in which the distribution shown in FIG. 6(a) is achieved by changing in a stepwise manner the thickness of the semi-insulating film, which has a uniform resistivity.

Figure 7B:
Figure 8A:
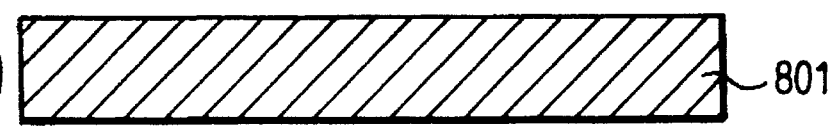
FIGS. 8(a) to 8(d) form a flowchart of an example of a method for fabricating the semi-insulating film shown in FIG. 7(b)
Figure 8B:
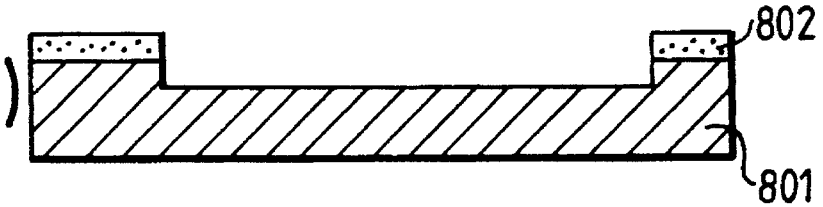
Figure 8C:
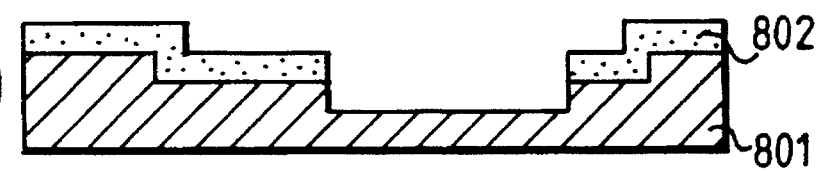
Figure 8D:

FIGS. 8(a) through 8(d) form a schematic flowchart. showing a method of fabricating a semi-insulating film 80 having a varying sheet-resistivity as shown in FIG. 7(b). First, a semi-insulating film 801 having a predetermined thickness is prepared, as shown in FIG. 8(a). Resist films 802 are then formed at portions of the surface of the semi-insulating film 80 where the thicknesses should be maximized to selectively wet- or dry-etching the exposed surface (FIG. 8(b)), and then portions except the portion whose thickness should be minimized are covered with a resist film 803 to selectively wet- or dry-etching the exposed surface (FIG. 8(c)). Thereafter, the resist film used for photoetching is completely removed and the semi-insulating film 80 with the desired shape is obtained (FIG. 8(d)).

Figure 9A:
FIGS. 9(a) to 9(e) for a flowchart of another example of a method for fabricating the semi-insulating film shown in FIG. 7(b)
Figure 9B:
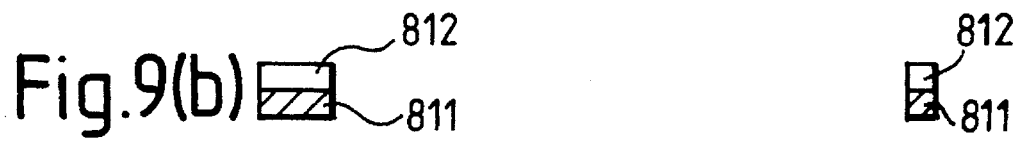
Figure 9C:
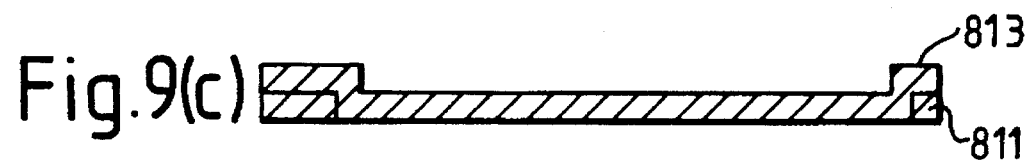
Figure 9D:
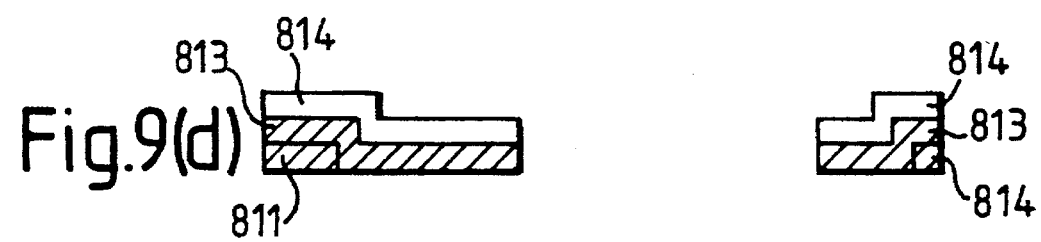
Figure 9E:
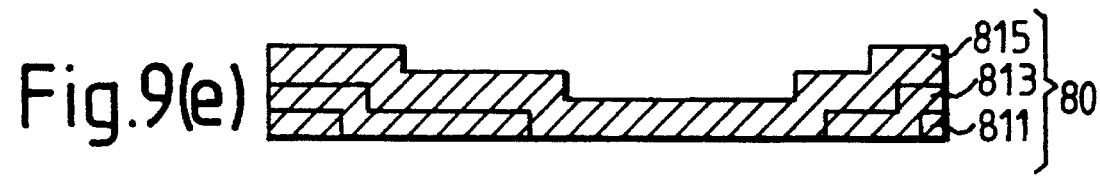

FIGS. 9(a) to 9(e) form a schematic flowchart showing another method for fabricating a semi-insulating film 80 having the variation in sheet resistivity shown in FIG. 7(b). First, a semi-insulating film 811 with a predetermined certain thickness is prepared (FIG. 9(a)). It is then wet- or dry-etched, using an ordinary photoetching technique, except at the ends of the film 811, which are covered with resist 812, as shown in FIG. 9(b). Then, a semi-insulating film 813 with a certain thickness is formed on the remaining portions of the semi-insulating film 811 and between them. This film 813 is then wet- or dry-etched by an ordinary photoetching technique, except at the ends of the film 813 which are covered with resist 814 as shown in FIG. 9(d). The resists are made slightly larger than those left at the step (b). Thereafter, a semi-insulating film 815 is formed on the remaining portions of the semi-insulating film 813 and between them, and the semi-insulating film 80 with the desired sheet resistivity distribution is obtained (FIG. 9(e)).

Figure 10A:
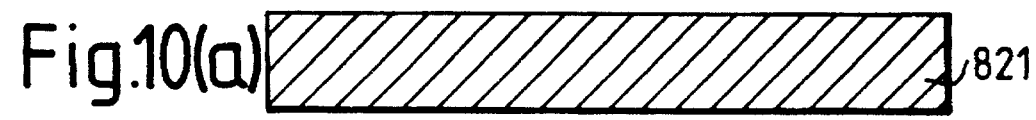
FIGS. 10(a) to 10(c) form a flowchart of an example of a method for fabricating the semi-insulating film shown in FIG. 6(a)
Figure 10B:
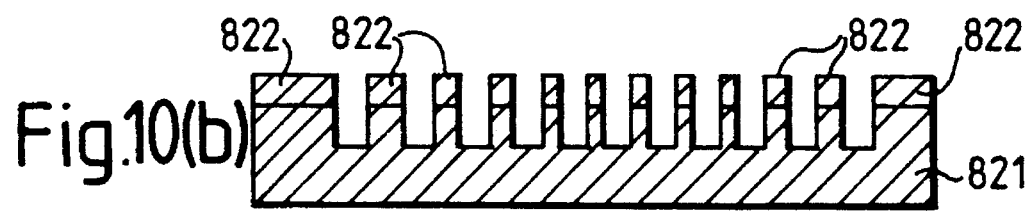
Figure 10C:
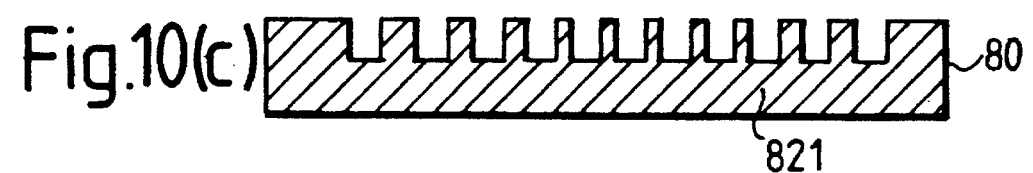

FIGS. 10(a) to 10(c) form a schematic flowchart showing a method for fabricating a semi-insulating film 80 having the varying sheet resistivity shown in FIG. 6(a). First, a semi-insulating film 821 with a constant sheet resistivity and a predetermined thickness is prepared (FIG. 10(a)). Then, a plurality of resist films 822 are formed on the semi-insulating film 821 with widths decreasing gradually from the ends of the film 821 toward the center (FIG. 10(b)). Exposed portions are then etched up to predetermined depths (FIG. 10(c)). This forms a semi-insulating film in which the thicknesses continuously change from the thick width portion to the thin width portion and the semi-insulating film 80 having a sheet resistivity varying approximately gradually is obtained.

Figure 11A:
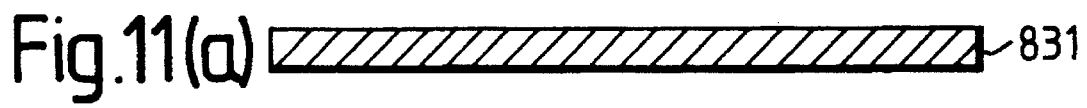
FIGS. 11(a) to 11(d) form a flowchart of another example of a method for fabricating the semi-insulating film shown in FIG. 6(a)
Figure 11B:
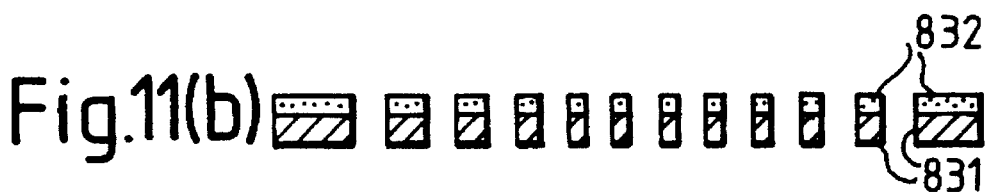
Figure 11C:
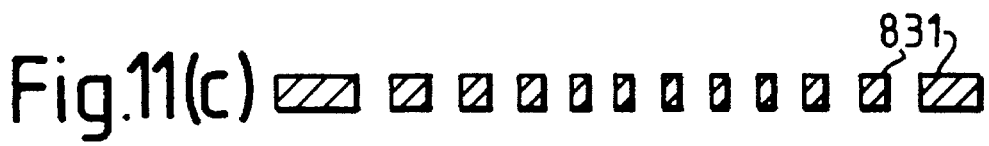
Figure 11D:
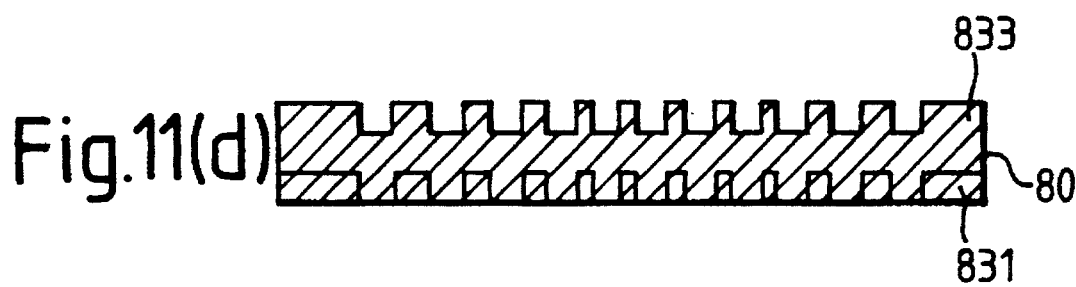

FIGS. 11(a) to 11(c) form a schematic flowchart showing another method for fabricating a semi-insulating film 80 having the varying sheet resistivity shown in FIG. 6(a). First, a semi-insulating film 831 with a constant sheet resistivity and a predetermined thickness is prepared (FIG. 11(a)). Then, a plurality of resist films 832 are formed on the semi-insulating film 831 with widths decreasing gradually from the ends of the film 831 toward the center, and all exposed portions are removed by etching (FIG. 11(b)). Then, the resist films 832 are removed (FIG. 11(c)) and thereafter a semi-insulating film 833 with a predetermined thickness is formed on the remaining portions of the semi-insulating films 831 and also between them (FIG. 11(d)). Hence, a semi-insulating film 80 having the same shape as that shown in FIG. 10 is obtained.

Figure 12A:
FIGS. 12(a) to 12(c) form a flowchart of another example of a method for fabricating the semi-insulating film shown in FIG. 6(a)
Figure 12B:
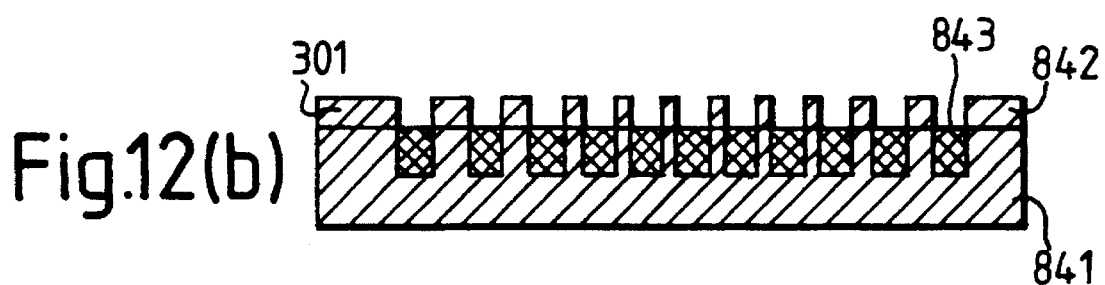
Figure 12C:
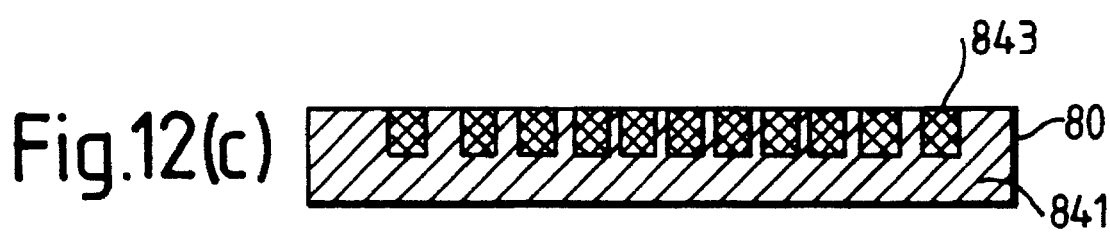

FIGS. 12(a) to 12(c) form a schematic flowchart showing yet another method for fabricating a semi-insulating film 80 having the varying sheet resistivity shown in FIG. 6(a). First, a semi-insulating film 841 with a constant sheet resistivity and a predetermined thickness is prepared (FIG. 12(a)). Then, a plurality of resist films 842 are formed on the semi-insulating film 841 with widths decreasing gradually from the ends of the film 841 toward the center. Oxygen or nitrogen ions are implanted from above the surface into exposed portions up to a predetermined depth (FIG. 12(b)). Thereafter, the resist films 842 are removed and the semi-insulating film 80 is completed (FIG. 2(c)). The semi-insulating film 80 thus formed has the variation in sheet resistivity distribution shown in FIG. 6(a) because the regions 843 where ions are implanted have larger resistivities than the regions where no ions are implanted.

FIGS. 13(c) to 13(d) form a schematic flowchart of another method for fabricating a semi-insulating film 80 having the varying sheet resistivity shown in FIG. 7(b). First, a semi-insulating film 851 with a constant sheet resistivity and a predetermined thickness is prepared (FIG. 13(a)). Then, a resist film 852 is formed on the semi-insulating film 851 except at a portion where the sheet resistivity is to be maximized. Oxygen or nitrogen ions are implanted from above the surface into the exposed portions up to a predetermined depth (FIG. 13(b)). Then, the opening in the resist film 852 is expanded, and oxygen and nitrogen ions are again implanted from above the surface (FIG. 13(c)). Thereafter, the resist film 852 is removed and the semi-insulating film 80 is thus completed (FIG. 13(d)). In semi-insulating film 80 thus formed, the region 853 in which ions have been implanted twice has a larger resistivity than that of the portion 854 in which ions have been implanted only once, and the portions 854 have a larger resistivity than the portion in which no ions have been implanted. Thus, the semi-insulating film 80 with the varying sheet resistivity shown in FIG. 7(b) is obtained.

FIG. 14(a) is a schematic sectional view of a fourth embodiment of a high breakdown voltage planar-type semiconductor device according to the present invention. Parts of the fourth embodiment which correspond to parts of the first embodiment are indicated by the same reference numerals.

In the fourth embodiment, a semi-insulating film 80 having a varying sheet resistivity is applied to a field plate structure known as a high breakdown voltage realizing art. The embodiment in FIG. 14(a) differs from the embodiment in FIG. 1 in that neither electric-field ring regions 16 nor first auxiliary electrodes 5 are used and the first main electrode 2 extends toward an auxiliary electrode 6 on the first insulating film 4. The variation in the electric sheet resistivity of the semi-insulating film 80 is shown by a continuous line in FIG. 14(b). This variation is such as approximately to equalize the electric field distribution of the film 80 to the electric field distribution of the surface of a semiconductor substrate 1. However, the variation in sheet resistivity shown by a dotted line in FIG. 14(b) is also possible because the main electrode 2 extends under the semi-insulating film 80.

Figure 15A:
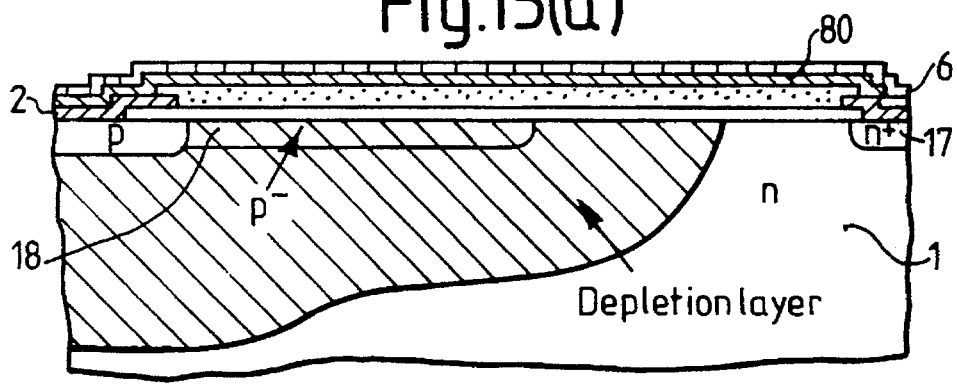
FIG. 15(a) is a schematic sectional view of a high breakdown voltage planar-type semiconductor device, being a fifth embodiment of the present invention, and FIG. 15(b) a diagram of the variation in sheet resistivity of the semi-insulating layer in the embodiment of FIG. 15(a)

FIG. 15(a) is a schematic sectional view of a fifth embodiment of a high breakdown voltage planar-type semiconductor device according to the present invention. Parts of the fifth embodiment which correspond to parts of the first embodiment are indicated by the same reference numerals.

Figure 15B:
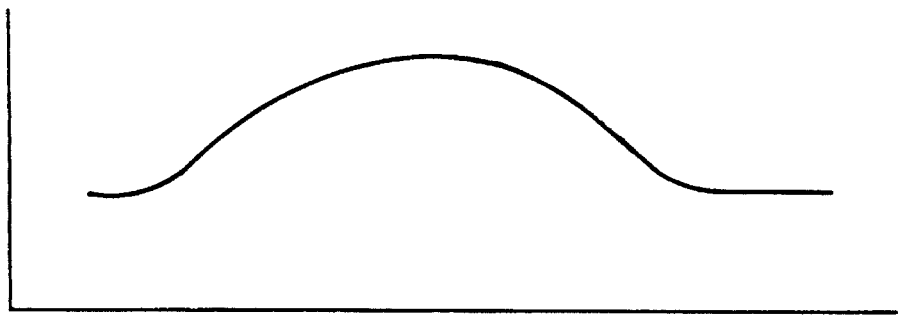

In the fifth embodiment, a semi-insulating film 80 having a varying sheet resistivity is applied to a junction termination extension structure known as a high breakdown voltage realizing art. The fifth embodiment of FIG. 15(a) differs from the fourth embodiment of FIG. 14(a) in that a p-type semi-conductor layer 18 contacting the p-type semiconductor layer 14 and extending toward the n$^+$-type ring region 17 is formed instead of extending the main electrode 2 toward the second auxiliary electrode 6. The variation in the sheet resistivity of the semi-insulating film 80 is shown by a continuous line in FIG. 15(b). It can be seen that the electric field distribution is equalized to the electric field distribution of the surface of the semiconductor substrate 1.

Figure 16A:
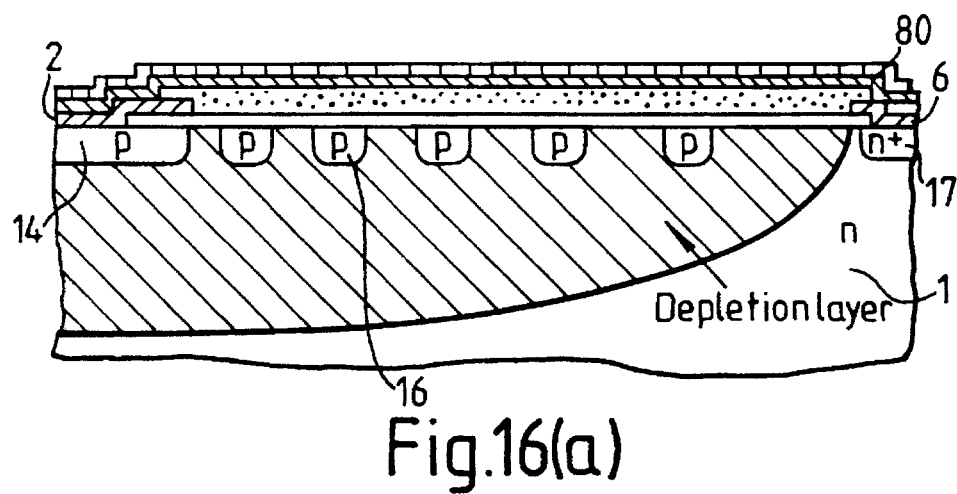
FIG. 16(a) is a schematic sectional view of a high breakdown voltage planar-type semiconductor device, being a sixth embodiment of the present invention.
Figure 16B:
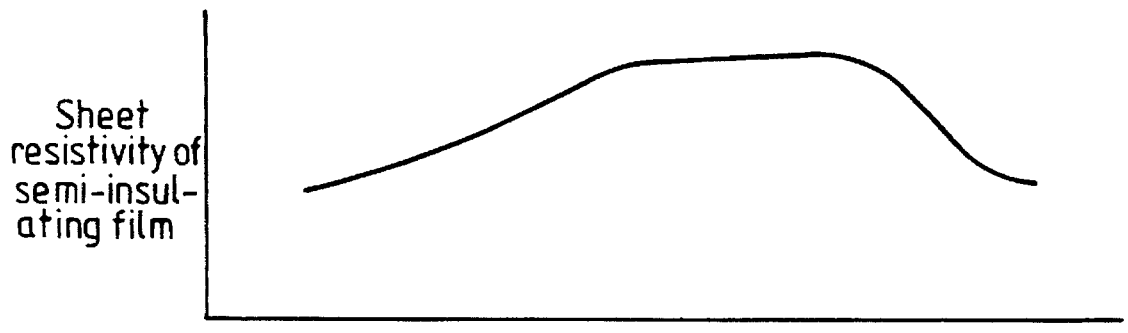
FIG. 16(b) is a diagram of the variation in sheet resistivity of the semi-insulating layer in the embodiment of FIG. 16(a)

FIG. 16(a) is a schematic sectional view of a high breakdown voltage planar-type semi-conductor device, being a sixth embodiment of the present invention. Parts of the sixth embodiment which correspond to parts of the first embodiment are indicated by the same reference numerals. In the sixth embodiment, a semi-insulating film 80 having a varying sheet resistivity is applied to a structure having electric-field restriction ring regions known as a high breakdown voltage realizing art. The sixth embodiment of FIG. 16(a) differs from the first embodiment of FIG. 1 in that the first auxiliary electrode 5 is not used. The variation in sheet resistivity of the semi-insulating film 80 is shown by a continuous line in FIG. 16(b). It can be seen that the electric field distribution is equalized to that of the surface of a semiconductor substrate 1.

Figure 17A:
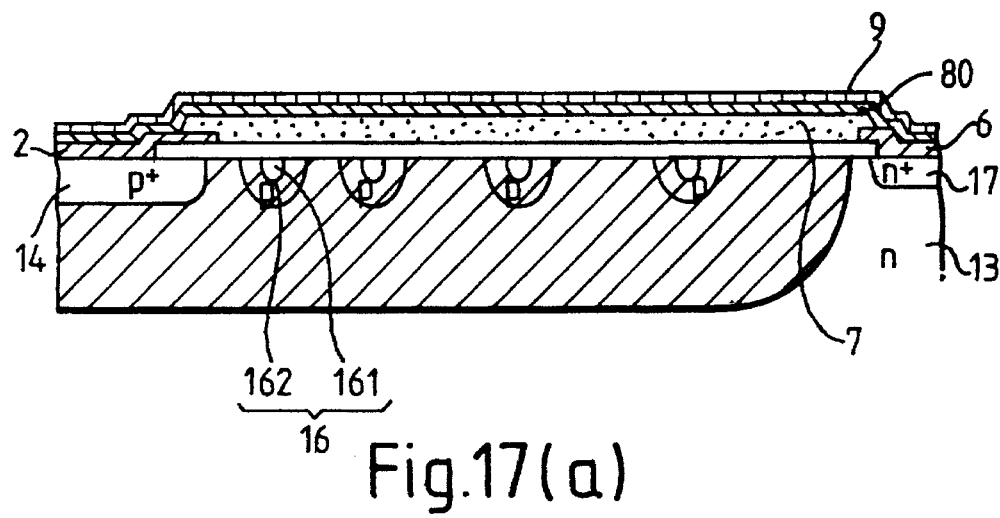
FIG. 17(a) is a schematic sectional view of a high breakdown voltage planar-type semiconductor device, being a seventh embodiment of the present invention.

FIG. 17(a) is a schematic sectional view of a high breakdown voltage planar-type semiconductor device, being a seventh embodiment of the present invention. Parts of the seventh embodiments which correspond to parts of the first embodiment are indicated by the same reference numerals.

Figure 17B:
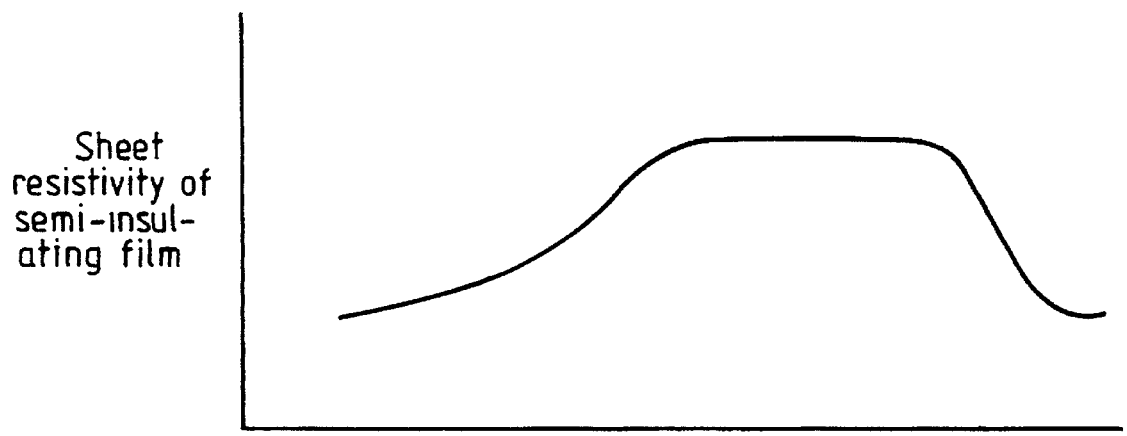
FIG. 17(d) is a diagram of the variation in potential on the semi-insulating layer in the embodiment of FIG. 17(a)

In the seventh embodiment, a semi-insulating film 80 having a varying sheet resistivity is applied to structure having an electric-field restriction ring regions known as a high breakdown voltage realizing art. The variation in sheet resistivity of the semi-insulating film 80 in the seventh embodiment such as to provide a variation in potential shown by the continuous line in FIG. 17(b). In the seventh embodiment, each electric-field restriction ring region 16 has a two-layer structure comprising a region 161 having a high impurity concentration and a region 162 surrounding the region 161 and having an impurity concentration lower than that of the region 161. This structure causes a depletion layer to expand in the low-impurity-concentration region 162 contacting the n-type semiconductor layer 13 and limits the expansion of the depletion layer in the high-impurity-concentration region 161 when the depletion layer reaches the electric field restriction ring region 16. Therefore, the surface potential of the electric-field restriction ring region 16 has a gradient in the low-impurity-concentration region 162 and becomes an equal potential in the high-impurity-concentration region 161. By providing each electric-field restriction ring region 16 with a two-layer structure, it is possible to reduce the equipotential distribution region and smooth the variation of the surface potential of the semiconductor substrate 1. It is then possible relatively easily to adjust the variation in sheet resistivity of the semi-insulating film 80 at an upper part of the semiconductor substrate 1.

Figure 18A:
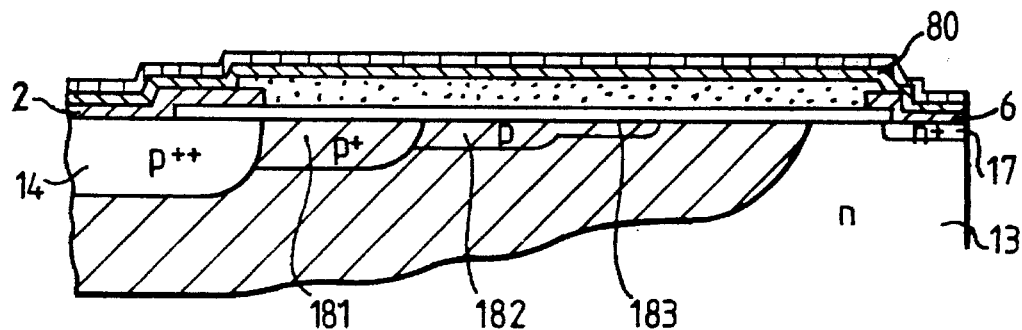
FIG. 18(a) is a schematic sectional view of a high breakdown voltage planar-type semiconductor device, being an eighth embodiment of the present invention.

FIG. 18(a) is a schematic sectional view of an eighth embodiment of a high breakdown voltage planar-type semiconductor device according to present invention. Parts of the eighth embodiment which correspond to parts of the first embodiment are indicated by the same reference numerals.

Figure 18B:
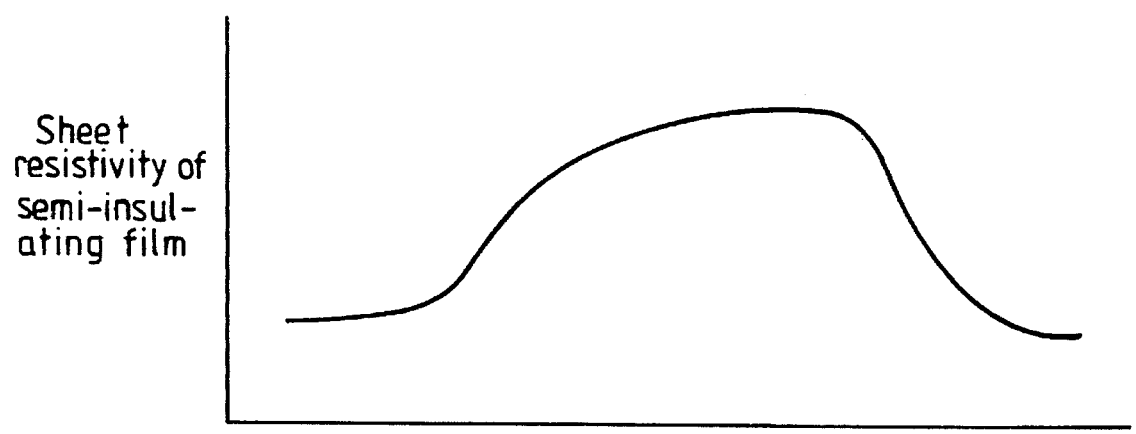
FIG. 18(b) is a diagram of the variation in potential on the semi-insulating layer in the embodiment of FIG. 18(a).

In the eighth embodiment, a semi-insulating film 80 having a varying sheet resistivity is applied to a junction termination extension structure known as a high breakdown voltage realizing art. The eighth embodiment of FIG. 18(a) differs from the seventh embodiment of FIG. 17(a) in that there are a plurality of p-type semiconductor regions 181, 182, and 183 which contact the p-type semiconductor layer 14 and extend toward the n$^+$-type ring region 17 and whose impurity concentration and depth decrease gradually, instead of the electric-field restriction ring regions 16. The variation in sheet resistivity of the semi-insulating film 80 is such as to provide a variation in potential which is shown by the continuous line in FIG. 18(b). In this embodiment, because the impurity concentration of the p-type semiconductor layer 14 on the surface of a semiconductor substrate 1 changes relatively gradually, the potential of the surface of the semiconductor substrate 1 also changes gradually and the variation in sheet resistivity of the semi-insulating film 80 can be adjusted relatively easily.

As described above, the present invention makes it possible to form an excellent high breakdown voltage planar-type semiconductor device having a high reliability not affected by electric charges or water in resin even if the device is sealed by resin. Moreover the present invention makes it possible to prevent breakdown even if a rapidly rising voltage is applied to the device.

What is claimed is:

1. A semiconductor device comprising:

a first semiconductor region, said first semiconductor region being of a first conductivity type and having a first main surface;

a second semiconductor region, said second semiconductor region being of a second conductivity type and extending into said first semiconductor region from said first main surface, a p-n junction being defined between said first and second semiconductor regions, first and second electrodes contacting said first and second semiconductor regions respectively;

a semi-insulating layer interconnecting said first and second electrodes, said semi-insulating layer having a sheet resistivity which varies between said first and second electrodes;

a first insulating layer between said semi-insulating layer and said first main surface of said first semiconductor region;

a second insulating layer for passivation covering said semi-insulating layer and said first and second electrodes;

further including at least one third semiconductor region, said at least one third semiconductor region being of said second conductivity type and extending into said first semiconductor region from said first main surface so as to surround said second semiconductor region, wherein said first insulating layer has at least one opening therein;

at least one third electrode which extends through said at least one opening to contact said at least one third semiconductor region; and wherein said at least one third electrode extends beyond said at least one third semiconductor region, to cover second parts of said first semiconductor region adjacent said at least one third semiconductor region, with said first insulating layer having at least one second part between said at least one third electrode and said second part of said first semiconductor region.

2. A semiconductor device according to claim 1, further comprising a third insulating layer extending over said third electrodes to insulate said third electrodes from said semi-insulating layer.

3. A semiconductor device comprising:

a first semiconductor region, said first semiconductor region being of a first conductivity type and having a first main surface;

a second semiconductor region, said second semiconductor region being of a second conductivity type and extending into said first semiconductor region from said first main surface, a p-n junction being defined between said first and second semiconductor regions;

first and second electrodes contacting said first and second semiconductor regions, respectively;

a semi-insulating layer interconnecting said first and second electrodes said semi-insulating layer having a sheet resistivity which varies between said first and second electrodes;

a first insulating layer between said semi-insulating layer and said first main surface of said first semiconductor region, said first insulating layer having at least one opening therein;

a second insulating layer for passivation covering said semi-insulating layer and said first and second electrodes; and at least one third semiconductor region, said at least one third semiconductor region being of said second conductivity type and extending into said first semiconductor region from said first main surface so as to surround said second semiconductor region; and at least one third electrode which extends through said at least one opening to contact said at least one third semiconductor region;

wherein said second electrode extends over said p-n junction to cover a first part of said first semiconductor region adjacent said p-n junction, with said first insulating layer having a first part between said second electrode and said first part of said first semiconductor region; and said at least one third electrode extends beyond said at least one third semiconductor region, to cover second parts of said first semiconductor region adjacent said at least one third semiconductor region, with said first insulating layer extending to have at least one second part between said at least one third electrode and said second part of said first semiconductor region.

4. A semiconductor device according to claim 3, wherein said second parts of said first semiconductor region are between said at least one third semiconductor region and said first electrode.

5. A semiconductor device according to claim 3, wherein said second part of said first semiconductor region are between said at least one third semiconductor region and said second semiconductor region.

6. A semiconductor device according to claim 3, wherein said first insulating layer has at least one third part between said at least one third electrode and said semi-insulating layer.

7. A semiconductor device according to claim 3, wherein said at least one third semiconductor region comprises a plurality of concentric annular semiconductor regions.

8. A semiconductor device according to claim 3, wherein said first semiconductor region includes a heavily doped part, and said first electrode contacts said heavily doped part of said first semiconductor region.

9. A semiconductor device according to claim 3, wherein said first semiconductor region has a second main surface, and there is a fourth electrode contacting said second main surface.

10. A semiconductor device according to claim 3, wherein said first semiconductor region includes a high impurity region and a substrate region having a lower impurity concentration than an impurity concentration of the high impurity region.

11. A semiconductor device according to claim 10, wherein the high impurity region is in direct contact with the first electrode and the substrate region is in direct contact with the second semiconductor region to form said pn junction.

12. A semiconductor device according to claim 3, further comprising a third insulating layer extending over said third electrodes to insulate said third electrodes from said semi-insulating layer.

13. A semiconductor device according to claim 9, wherein said first semiconductor region includes a high impurity region in direct contact with said fourth electrode.

14. A semiconductor device according to claim 9, wherein said first semiconductor region includes a first high impurity region in direct contact with said first electrode and a second high impurity region in direct contact with said fourth electrode.

15. A semiconductor device according to claim 3, wherein said sheet resistivity of said semi-insulating layer has a maximum value intermediate said first and second electrodes.

16. A semiconductor device according to claim 3, wherein said sheet resistivity of said semi-insulating layer varies stepwise between said first and second electrodes.

17. A semiconductor device according to claim 3, wherein the sheet resistivity of said semi-insulating layer is less than $10^{15} \Omega/\square$.

* * * * *